(12) United States Patent
Penney et al.

(10) Patent No.: US 9,966,116 B2
(45) Date of Patent: *May 8, 2018

(54) APPARATUSES AND METHODS FOR STORING A DATA VALUE IN A SENSING CIRCUITRY ELEMENT

(71) Applicant: Micron Technology, Inc., Boise, ID (US)

(72) Inventors: Daniel B. Penney, Wylie, TX (US); Harish N. Venkata, Allen, TX (US); Guy S. Perry, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/693,064

(22) Filed: Aug. 31, 2017

(65) Prior Publication Data

US 2018/0025758 A1 Jan. 25, 2018

Related U.S. Application Data

(63) Continuation of application No. 15/216,256, filed on Jul. 21, 2016, now Pat. No. 9,767,864.

(51) Int. Cl.
*G11C 7/06* (2006.01)
*G11C 7/10* (2006.01)
(Continued)

(52) U.S. Cl.
CPC ............... *G11C 7/065* (2013.01); *G11C 7/10* (2013.01); *G11C 7/12* (2013.01); *G11C 7/222* (2013.01); *G11C 8/10* (2013.01)

(58) Field of Classification Search
CPC .. G11C 7/065; G11C 7/10; G11C 7/12; G11C 7/222; G11C 8/10
See application file for complete search history.

(56) References Cited

U.S. PATENT DOCUMENTS

| 4,380,046 A | 4/1983 | Fung |
| 4,435,792 A | 3/1984 | Bechtolsheim |

(Continued)

FOREIGN PATENT DOCUMENTS

| CN | 102141905 | 8/2011 |
| EP | 0214718 | 3/1987 |

(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing—Issues in embedded single-chip multicore architectures.

(Continued)

*Primary Examiner* — Tri Hoang
(74) *Attorney, Agent, or Firm* — Brooks, Cameron & Huebsch, PLLC

(57) ABSTRACT

The present disclosure includes apparatuses and methods related to storing a data value in a sensing circuitry element. An example method comprises sensing a first data value with a sense amplifier of a sensing circuitry element, moving a second data value from a first storage location of a compute component to a second storage location of the compute component, and storing, in the first storage location, a third data value resulting from a logical operation performed on the first data value and the second data value. The logical operation can be performed by logic circuitry of the sensing circuitry element.

20 Claims, 6 Drawing Sheets

(51) Int. Cl.
  *G11C 7/12*    (2006.01)
  *G11C 8/10*    (2006.01)
  *G11C 7/22*    (2006.01)

(56) References Cited

U.S. PATENT DOCUMENTS

| | | |
|---|---|---|
| 4,435,793 A | 3/1984 | Ochil |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |

(56) References Cited

U.S. PATENT DOCUMENTS

| | | | |
|---|---|---|---|
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0032778 A1* | 2/2011 | Iwai .................. G11C 11/4076 |
| | | 365/189.16 |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1* | 3/2015 | Cowles .................. G11C 19/00 |
| | | 365/189.12 |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1* | 12/2015 | Tiwari ................ G06F 9/30029 |
| | | 714/719 |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0308513 A1 | 10/2016 | Park et al. |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |

(56) References Cited

FOREIGN PATENT DOCUMENTS

| KR | 10-2010-0134235 | 12/2010 |
|---|---|---|
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved form : http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

* cited by examiner

RESULT IN FIRST STORAGE LOCATION -- (AFTER SENSE AMP FIRE)

| | | BOOL3, BOOL2, BOOL1, BOOL0 | | | | | | | | |
|---|---|---|---|---|---|---|---|---|---|---|
| | | 0000 | 0001 | 0010 | 0101 | 0100 | 0110 | 1000 | 1001 | 1010 |
| A | B | A | A*B | A*$\bar{B}$ | B | A+B | AXB | A+$\bar{B}$ | $\overline{AXB}$ | $\bar{B}$ |
| 0 | 0 | 0 | 0 | 0 | 0 | 0 | 0 | 1 | 1 | 1 |
| 0 | 1 | 0 | 0 | 0 | 1 | 1 | 1 | 0 | 0 | 0 |
| 1 | 0 | 1 | 0 | 1 | 0 | 1 | 1 | 1 | 0 | 1 |
| 1 | 1 | 1 | 1 | 0 | 1 | 1 | 0 | 1 | 1 | 0 |

*Fig. 4A*

RESULT IN SENSE AMP -- (BEFORE SENSE AMP FIRE)

| | | BOOL3, BOOL2, BOOL1, BOOL0 | | | | | | | | |
|---|---|---|---|---|---|---|---|---|---|---|
| | | 0000 | 0001 | 0010 | 0101 | 0100 | 0110 | 1000 | 1001 | 1010 |
| A | B | B | A+B | $\bar{A}$*B | A | A*B | RESET | $\bar{A}$+B | SET | $\bar{A}$ |
| 0 | 0 | 0 | 0 | 0 | 0 | 0 | 0 | 1 | 1 | 1 |
| 0 | 1 | 1 | 1 | 1 | 0 | 0 | 0 | 1 | 1 | 1 |
| 1 | 0 | 0 | 1 | 0 | 1 | 0 | 0 | 0 | 1 | 0 |
| 1 | 1 | 1 | 1 | 0 | 1 | 1 | 0 | 1 | 1 | 0 |

*Fig. 4B*

APPARATUSES AND METHODS FOR STORING A DATA VALUE IN A SENSING CIRCUITRY ELEMENT

PRIORITY INFORMATION

This application is a Continuation of U.S. application Ser. No. 15/216,256, filed Jul. 21, 2016, which issues as U.S. Pat. No. 9,767,864 on Sep. 19, 2017, the contents of which are included herein by reference.

TECHNICAL FIELD

The present disclosure relates generally to semiconductor memory and methods, and more particularly, to apparatuses and methods related to storing a data value in a sensing circuitry element.

BACKGROUND

Memory devices are typically provided as internal, semiconductor, integrated circuits in computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processing resource can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of logical operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and data may also be sequenced and/or buffered.

In many instances, the processing resources (e.g., processor and/or associated functional unit circuitry) may be external to the memory array, and data is accessed via a bus between the processing resources and the memory array to execute a set of instructions. Processing performance may be improved in a processing-in-memory (PIM) device, in which a processing resource may be implemented internal and/or near to a memory (e.g., directly on a same chip as the memory array). A PIM device may reduce time in processing and may also conserve power. Data movement between and within arrays and/or subarrays of various memory devices, such as processing-in-memory devices, can affect processing time and/or power consumption.

BRIEF DESCRIPTION OF THE DRAWINGS

FIG. 4A is a logic table illustrating selectable logic operation results implemented by sensing circuitry with a logical operation result in a first storage location of a compute component after a sense amplifier is enabled in accordance with a number of embodiments of the present disclosure.

FIG. 4B is a logic table illustrating selectable logic operation results implemented by sensing circuitry with a logical operation result in a sense amplifier before the sense amplifier is enabled in accordance with a number of embodiments of the present disclosure.

DETAILED DESCRIPTION

Figure 1:
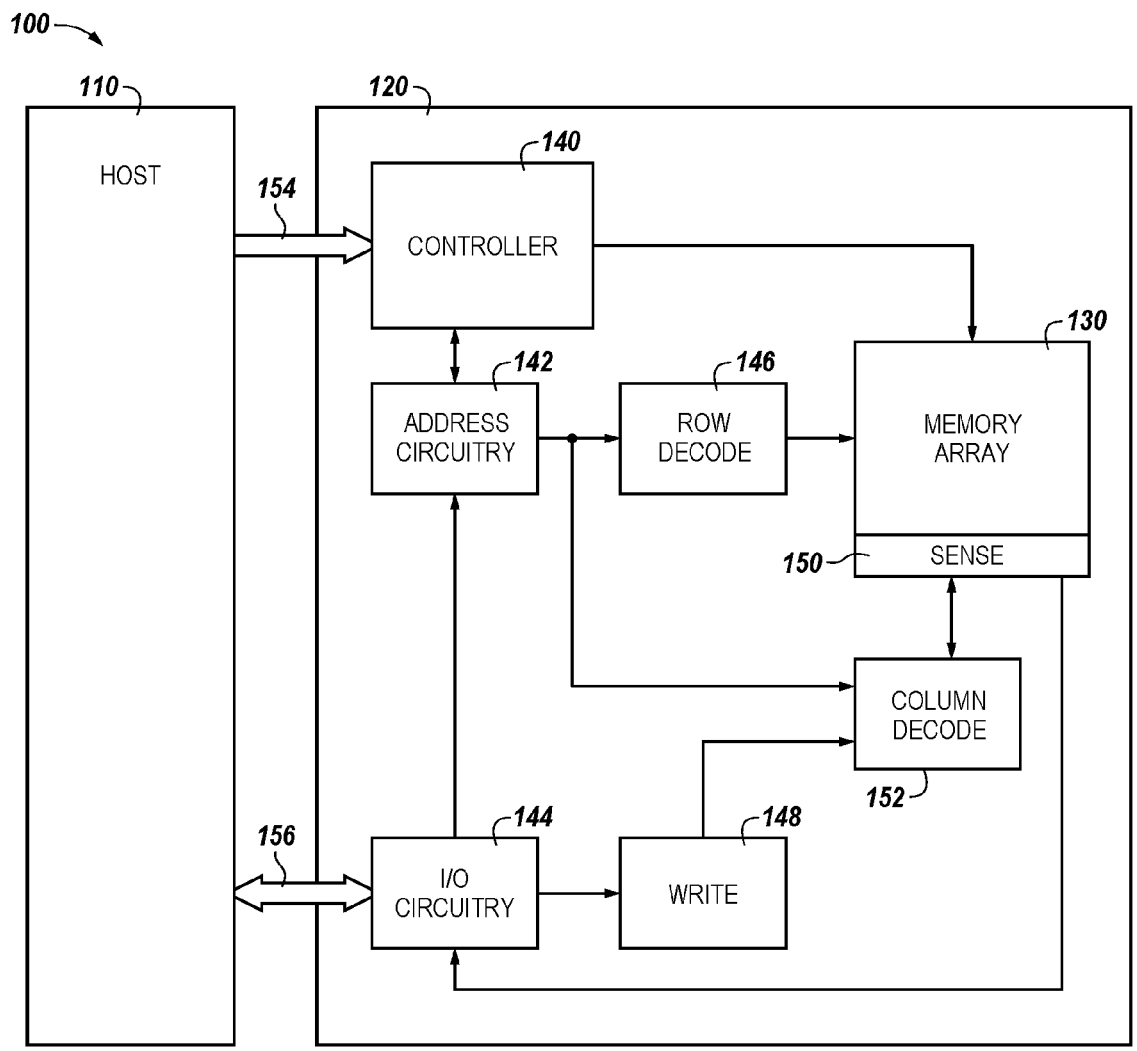
FIG. 1 is a block diagram of an apparatus in the form of a computing system including a memory device in accordance with a number of embodiments of the present disclosure.

The present disclosure includes apparatuses and methods related to using an existing storage location in sensing circuitry to store a data value prior to performing a logical operation. As used herein, "sensing circuitry" includes a sense amplifier, logic circuitry, and a compute component. The compute component can comprise a first storage location and a second storage location. An example method comprises using sensing circuitry to move a data value from a first storage location to a second storage location and then move the data value to logic circuitry. A controller can be coupled to the sensing circuitry. In some embodiments, the first and second storage locations can each comprise a respective latch (e.g., cross-coupled transistors).

In some approaches, the second storage location may be used exclusively for data shift operations. The sense amplifier may store a first data value and the first storage location can store a second data value. The result of a logical operation may be stored in the first storage location. However, the first storage location would store both the second data value and the result of the logical operation at the same time, which is incompatible. Thus, another storage location may be added to the logic circuitry to store the second data value. After the second data value has been moved to the additional storage location, the logical operation may then be performed on the second data value and the first data value stored in the sense amplifier.

The additional storage location can be removed from the sensing circuitry by using the second storage location of the compute component for data shift operations as well as logical operations. The second storage location can store the second data value. The second storage location can be coupled to the logic circuitry. After the logical operation has been performed, a result of the logical operation can then be stored in the first storage location.

Moving a data value in a memory device can consume more power than other memory device operations. In some examples, moving a data value can consume up to four times as much power as other memory device operations. Embodiments of the present disclosure seek to reduce the amount of power consumed in moving a data value in a memory device. For example, a number of embodiments of the present disclosure can facilitate moving a data value in sensing circuitry in a more efficient manner as compared to previous approaches.

A discrete collection of elements that comprise sensing circuitry associated with a pair of complimentary digit lines may be referred to as a "sensing circuitry element." For example, the sensing circuitry element for a particular pair of complimentary digit lines can include a sense amplifier, logic circuitry, and a compute component that are associated with the particular pair of complimentary digit lines (e.g., that are on pitch with the particular pair of complimentary digit lines). In some embodiments, a sensing circuitry element can be connected to another sensing circuitry element such that data values (e.g., bits) may be moved (e.g., shifted) from one sensing circuitry element to another sensing circuitry element. Shifting data values between one sensing circuitry element and another sensing circuitry element can be done synchronously such that a sensing circuitry element receives a data value from another sensing circuitry element as the sensing circuitry element passes its data value to yet another sensing circuitry element. In some embodiments, shifting data in sensing circuitry can facilitate various processing functions such as the multiplication, addition, etc. of two data values.

In some approaches, data values may be stored, at least temporarily, in a sensing circuitry element using a dynamic capacitance associated with at least one node of the sensing circuitry element. However, storing data values using a dynamic capacitance may have drawbacks such as lost charge, leaked charge, and/or charge coupling that may affect accurate storage of the data values. Notably, embodiments of the present disclosure may alleviate such drawbacks by providing more than one non-dynamic storage location per sensing circuitry element, such as static latches. For example, some embodiments can allow for moving data values in sensing circuitry without depending upon (or relying on) dynamic capacitance, and instead may allow for data values to be actively held (e.g., latched).

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "n", particularly with respect to reference numerals in the drawings, indicate that a number of the particular feature so designated can be included. As used herein, "a number of" a particular thing refers to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 306 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a controller 140, a memory array 130, and/or sensing circuitry 150 might also be separately considered an "apparatus."

The system 100 includes a host 110 coupled (e.g., connected) to the memory device 120, which includes a memory array 130. The host 110 can be a host system such as a personal laptop computer, a desktop computer, a digital camera, a smart phone, or a memory card reader, among various other types of hosts. The host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a hybrid memory cube (HMC), computational memory such as a processing-in-memory random access memory (PIMRAM) array, which can include one or more of a DRAM array, SRAM array, STT RAM array, PCRAM array, TRAM array, RRAM array, NAND flash array, and/or NOR flash array, for instance. The memory array 130 can comprise memory cells arranged in rows coupled by access lines, which may be referred to herein as word lines or select lines, and columns coupled by digit lines, which may be referred to herein as data lines or sense lines. Although a single memory array 130 is shown in FIG. 1, embodiments are not so limited. For instance, the memory device 120 may include a number of memory arrays 130 (e.g., a number of banks of DRAM cells, NAND flash cells, etc.).

The memory device 120 can include address circuitry 142 to latch address signals for data provided over an input/ output "I/O" bus 156 (e.g., data bus and/or address bus) through I/O circuitry 144 (e.g., provided to external ALU circuitry and to DRAM DQs via local I/O lines and global I/O lines). Address signals are received through address circuitry 142 and decoded by a row decoder 146 and a column decoder 152 to access the memory array 130. Data can be read from the memory array 130 by sensing voltage and/or current changes on the digit lines using the sensing circuitry 150. The sensing circuitry 150 can read and latch a page (e.g., row) of data from the memory array 130. The I/O circuitry 144 can be used for bi-directional data communication with the host 110 over the I/O bus 156. The write circuitry 148 can be used to write data to the memory array 130.

The controller 140 (e.g., memory controller) decodes signals provided by the control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110 and sequencing access to the memory array 130. The controller 140 can be a state machine, sequencer, or some other type of controller, and include hardware and/or firmware (e.g., microcode instructions) in the form of an application specific integrated circuit (ASIC). The controller 140 can control, for example, generation of clock signals and application of the clock signals to a compute component in sensing circuitry in association with shifting data in accordance with embodiments described herein.

As described further below, in a number of embodiments, the sensing circuitry 150 can comprise a sense amplifier and a compute component. The compute component may also be referred to herein as an accumulator, and can be used to perform logical operations (e.g., on data associated with complementary digit lines). According to various embodiments, the compute component comprises a first storage location and a second storage location. The first and second storage locations of the compute components can serve as stages of a shift register. For example, clock signals can be applied to the compute components to move data values between the first and second storage locations and to shift data between adjacent compute components.

In a number of embodiments, the sensing circuitry 150 can be used to perform logical operations using data stored in the memory array 130 as inputs and/or store the results of the logical operations back to the memory array 130 without transferring data via a digit line address access (e.g., without firing a column decode signal). As such, various compute functions can be performed using, and within, the sensing circuitry 150 rather than (or in association with) being performed by processing resources external to the sensing circuitry 150 (e.g., by a processing resource associated with the host 110 and/or other processing circuitry, such as ALU circuitry, located on device 120 (e.g., on the controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, the sensing circuitry 150 is configured to perform logical operations on data stored in the memory array 130 and store the result back to the memory array 130 without enabling an I/O line (e.g., a local I/O line) coupled to the sensing circuitry 150. The sensing circuitry 150 can be formed on pitch with the memory cells of the array.

As such, in a number of embodiments, circuitry external to the memory array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., the host 110). For instance, the host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to performing logical operations using sensing circuitry (e.g., the sensing circuitry 150) without enabling column decode lines of the memory array 130. Whether or not local I/O lines are used in association with performing logical operations via sensing circuitry 150, the local I/O line(s) may be enabled in order to transfer a result to a suitable location other than back to the memory array 130 (e.g., to an external register).

Figure 2:
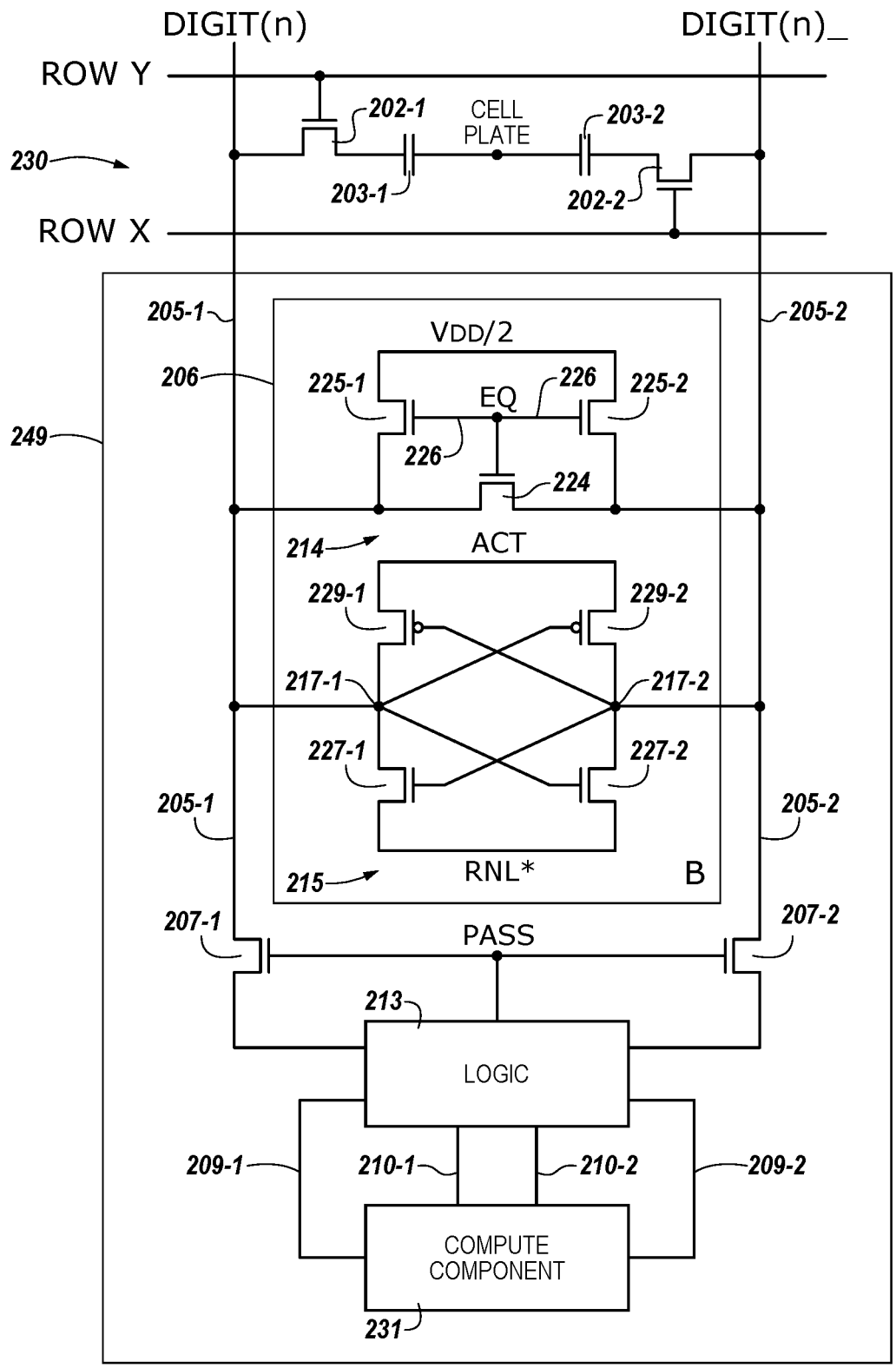
FIG. 2 is a schematic diagram of a portion of a memory array including sensing circuitry in accordance with a number of embodiments of the present disclosure.

FIG. 2 is a schematic diagram illustrating a portion of a memory array 230 including sensing circuitry in accordance with a number of embodiments of the present disclosure. FIG. 2 illustrates one sensing circuitry element 249 which can be one of a number of sensing circuitry elements corresponding to the sensing circuitry 150 shown in FIG. 1. In the example shown in FIG. 2, the memory array 230 is a DRAM array of 1T1C (one transistor one capacitor) memory cells in which a transistor serves as the access device and a capacitor serves as the storage element; although other embodiments of configurations can be used (e.g., 2T2C with two transistors and two capacitors per memory cell). In this example, a first memory cell comprises a transistor 202-1 and a capacitor 203-1, and a second memory cell comprises a transistor 202-2 and a capacitor 203-2, etc.

The cells of the memory array 230 can be arranged in rows coupled by access lines 204-X (Row X), 204-Y (Row Y), etc., and columns coupled by pairs of complementary digit lines (e.g., the digit line 205-1 labelled DIGIT(n) and the digit line 205-2 labeled DIGIT(n)_ in FIG. 2). Although only one pair of complementary digit lines are shown in FIG. 2, embodiments of the present disclosure are not so limited, and an array of memory cells can include additional columns of memory cells and complementary digit lines (e.g., 4,096, 8,192, 16,384, etc.).

Memory cells can be coupled to different digit lines and access lines. For instance, in this example, a first source/drain region of the transistor 202-1 is coupled to the digit line 205-1, a second source/drain region of the transistor 202-1 is coupled to the capacitor 203-1, and a gate of the transistor 202-1 is coupled to the access line 204-Y. A first source/drain region of the transistor 202-2 is coupled to the digit line 205-2, a second source/drain region of the transistor 202-2 is coupled to the capacitor 203-2, and a gate of the transistor 202-2 is coupled to the access line 204-X. A cell plate, as shown in FIG. 2, can be coupled to each of the capacitors 203-1 and 203-2. The cell plate can be a common node to which a reference voltage (e.g., ground) can be applied in various memory array configurations.

The digit lines 205-1 and 205-2 of the memory array 230 are coupled to the sensing circuitry element 249 in accordance with a number of embodiments of the present disclosure. The sense amplifier 206 is coupled to the pair of complementary digit lines 205-1 and 205-2. The sense amplifier 206 is coupled to the logic circuitry 213 via pass transistors 207-1 and 207-2. The compute component 231 is coupled to the logic circuitry 213 via the first storage location lines 209-1 and 209-2 and the second storage location lines 210-1 and 210-2. As used herein, "logic circuitry" can include logic circuitry, for example, configured to perform Boolean logic operations.

The logic circuitry 213 can be coupled to the pair of complementary digit lines 205-1 and 205-2 and configured to perform logical operations on data stored in array 230. For example, the logic circuitry 213 can be configured to control the state of (e.g., turn on/turn off) the pass transistors 207-1 and 207-2 based on a selected logical operation that is being performed.

The sense amplifier 206 can be operated to determine a data value (e.g., a logic state) stored in a selected memory cell. The sense amplifier 206 can comprise a cross coupled latch 215 (e.g., the gates of a pair of transistors, such as the n-channel transistors 227-1 and 227-2 are cross coupled with the gates of another pair of transistors, such as the p-channel transistors 229-1 and 229-2), which can be referred to herein as a primary latch. However, embodiments are not limited to this example.

In operation, when a memory cell is being sensed (e.g., read), the voltage on one of the digit lines 205-1 or 205-2 will be slightly greater than the voltage on the other one of the digit lines 205-1 or 205-2. An ACT signal and an RNL* signal can be driven low to enable (e.g., fire) the sense amplifier 206. The digit line 205-1 or 205-2 having the lower voltage will turn on one of the transistors 229-1 or 229-2 to a greater extent than the other of the transistors 229-1 or 229-2, thereby driving high the digit line 205-1 or 205-2 having the higher voltage to a greater extent than the other digit line 205-1 or 205-2 is driven high.

Similarly, the digit line 205-1 or 205-2 having the higher voltage will turn on one of the transistors 227-1 or 227-2 to a greater extent than the other of the transistors 227-1 or 227-2, thereby driving low the digit line 205-1 or 205-2 having the lower voltage to a greater extent than the other digit line 205-1 or 205-2 is driven low. As a result, after a short delay, the digit line 205-1 or 205-2 having the slightly greater voltage is driven to the voltage of the supply voltage $V_{DD}$ through a source transistor, and the other digit line 205-1 or 205-2 is driven to the voltage of the reference voltage (e.g., ground) through a sink transistor. Therefore, the cross coupled transistors 227-1 and 227-2 and the cross coupled transistors 229-1 and 229-2 serve as a sense amplifier pair, which can amplify the differential voltage on the digit lines 205-1 and 205-2 and operate to latch a data value sensed from the selected memory cell.

Embodiments are not limited to the sensing circuitry element 249 configuration illustrated in FIG. 2. As an example, the sense amplifier 206 can be a current-mode sense amplifier and/or a single-ended sense amplifier (e.g., sense amplifier coupled to one digit line). Also, embodiments of the present disclosure are not limited to a folded digit line architecture such as that shown in FIG. 2.

In this example, the sense amplifier 206 includes equilibration circuitry 214, which can be configured to equilibrate the digit lines 205-1 and 205-2. The equilibration circuitry 214 comprises a transistor 224 coupled between the digit lines 205-1 and 205-2. The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of a transistor 225-1 is coupled to the digit line 205-1, and a second source/drain region of a transistor 225-2 is coupled to the digit line 205-2. The gates of the transistors 224, 225-1, and 225-2 can be coupled together and to an equilibration (EQ) control signal line 226. As such, activating EQ enables the transistors 224, 225-1, and 225-2, which effectively shorts the digit lines 205-1 and 205-2 together and to the equilibration voltage (e.g., $V_{DD}/2$). Although FIG. 2 shows the sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

Figure 3:
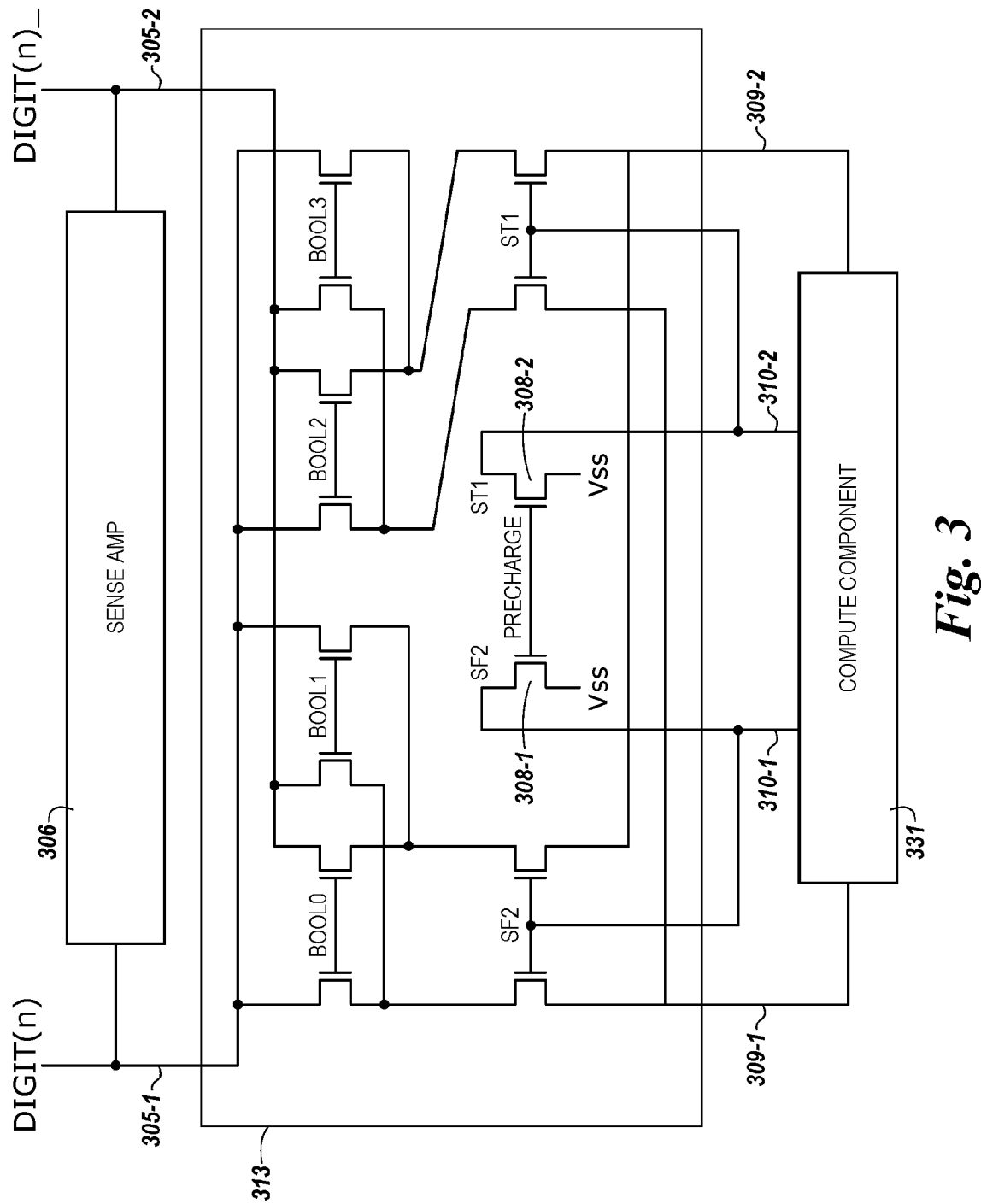
FIG. 3 is a schematic diagram of a sensing circuitry element including logic circuitry in accordance with a number of embodiments of the present disclosure.

FIG. 3 is a schematic diagram of a sensing circuitry element (e.g., the sensing circuitry element 206 shown in FIG. 2) including an example of logic circuitry 313 in accordance with a number of embodiments of the present disclosure. Although not shown, memory cells, such as those described in FIG. 2, are coupled to the pairs of complementary digit lines 305-1 and 305-2. The logic circuitry 313 illustrated in FIG. 3 is an example of logic circuitry that can be used with embodiments in accordance with the present disclosure. The logic circuitry 313 can be coupled to the pair of complimentary digit lines 305-1 and 305-2 via the source drain regions of four pairs of transistors. Gates of each of the four pairs of transistors can be coupled to signal lines that can apply four control signals. Each of the four pairs of transistors can correspond to one of the four logic signals denoted as BOOL0, BOOL1, BOOL2, and BOOL3. The four logic signals can be used to perform logical operations in the sensing circuitry as described in more detail with respect to FIGS. 4A-4B.

The logic circuitry 313 can be coupled to the compute component 331 via the first storage location lines 309-1 and 309-2 and the second storage location lines 310-1 and 310-2. The compute component 331 can be analogous to the compute component 531 illustrated in FIG. 5 and discussed in detailed herein. The first storage location lines 309-1 and 309-2 can be coupled to source drain regions of transistors other than the four pairs of transistors previously described. The second storage location line 310-1 can couple the node SF2 of the compute component 331 (shown in detail as the compute component 531 in FIG. 5) to gates and source drain regions of transistors (e.g., 308-1) other than the four pairs of transistors previously described. The second storage location line 310-2 can couple the node ST1 of the compute component 331 (shown in detail as the compute component 531 in FIG. 5) to gates and source drain regions of transistors (e.g., transistor 308-2) other than the four pairs of transistors previously described. A terminal of each of the transistors 308-1 and 308-2 can be coupled to a reference voltage (e.g., Vss). The gates of the transistors 308-1 and 308-2 can be coupled to a PRECHARGE signal.

FIG. 4A is a logic table illustrating selectable logic operation results implemented by sensing circuitry with a logical operation result in a first storage location of a compute component after a sense amplifier is enabled in accordance with a number of embodiments of the present disclosure. FIG. 4A shows a resultant data value that is initially stored in the first storage location (e.g., first storage location 533 shown in FIG. 5) after the sense amplifier (e.g., sense amplifier 506 shown in FIG. 5) is enabled (e.g., fired). Starting data values (e.g., operands) for a particular logical operation can be stored in the sense amplifier and/or the first storage location from the memory array. For the purpose of describing FIGS. 4A and 4B, a first data value (e.g., "A") is a data value that can be read from a memory array and stored in the first storage location and a second data value (e.g., "B"), is a data value that can be read from the memory array stored in the sense amplifier. In the rest of this disclosure a first data value is a data value that can be read from the memory array stored in the sense amplifier and a second data value is a data value that can be read from a memory array and stored in the first storage location.

A selected logical operation between the first data value and a second data can be performed based on the appropriate control signals corresponding to the selected logical operation being provided to the logic circuitry (e.g., logic circuitry 313 shown in FIG. 3). For instance, in FIG. 4A, "RESULT IN FIRST STORAGE LOCATION—(AFTER SENSE AMP FIRE)" indicates that the control signals corresponding to the selected logical operation are enabled after the sense amplifier is enabled, such that the result of the selected logical operation is initially stored in the first storage location. Similarly, in FIG. 4B, "RESULT IN SENSE AMP— (BEFORE SENSE AMP FIRE)" indicates that the control signals corresponding to the selected logical operation are enabled before the sense amplifier is enabled, such that the result of the selected logical operation is initially stored in the sense amplifier.

The logic table illustrated in FIG. 4A shows the starting data value stored in the first storage location in column A at 470, and shows the starting data value stored in the sense amplifier in column B at 472. The various combinations of the control signals BOOL0, BOOL1, BOOL2, and BOOL3 are shown in FIG. 4A in the column headings in row 474. For example, the column heading of "0110" indicates that the results in that column correspond to control signal BOOL3 being a "0," control signal BOOL2 being a "1," control signal BOOL1 being a "1," and control signal BOOL0 being a "0."

The results for each combination of starting data values in the first storage location ("A") and in the sense amplifier ("B") can be summarized by the logical operation shown for each column in row 476. For example, the result for the values of BOOL3, BOOL2, BOOL1, and BOOL0 of "0000" are summarized as "A" since the result (initially stored in the first storage location after the sense amplifier fires) is the same as the starting value in the first storage location. Other columns of results are similarly annotated in row 476, where "A*B" intends A AND B, "A+B" intends A OR B, and "AXB" intends A XOR B. By convention, a bar over a data value or a logical operation indicates an inverted value of the quantity shown under the bar. For example, AXB bar intends NOT A XOR B, which is also A XNOR B.

FIG. 4B is a logic table illustrating selectable logic operation results implemented by sensing circuitry with a logical operation result in a sense amplifier before the sense amplifier is enabled in accordance with a number of embodiments of the present disclosure. FIG. 4B shows a resultant data value that is initially stored in the sense amplifier (e.g., sense amplifier 506 shown in FIG. 5) after the sense amplifier is enabled corresponding to the various combinations of control signals BOOL3, BOOL2, BOOL1, and BOOL0. The logic table illustrated is arranged similar to that described with respect to FIG. 4A, with the starting data value stored in the first storage location shown in column A at 470, and the starting data value stored in the sense amplifier shown in column B at 472. The various combinations of the control signals BOOL0, BOOL1, BOOL2, and BOOL3 is shown in FIG. 4B in the column headings shown in row 474, and the logical operation represented by each respective column of results shown in the column subheading at row 476.

In contrast with the logical operations summarized in the logic table illustrated in FIG. 4A, which reflects a logical operation result initially stored in the first storage location after the sense amplifier is enabled, the logical operations summarized in the logic table illustrated in FIG. 4B reflects a logical operation result initially stored in the sense amplifier 506 after the sense amplifier is enabled (e.g., with the control signals corresponding to the selected logic operation being provided to the logic circuitry 313 before the sense amplifier is enabled). The logical operations summarized in the logic table illustrated in FIG. 4B include several different logical operations from those shown in the logic table illustrated in FIG. 4A including "B" (the logical operation result initially stored in the sense amplifier after the sense amplifier is enabled is the same as the starting data value in the sense amplifier), "RESET" (the logical operation result initially stored in the sense amplifier after the sense amplifier is enabled is always set to "0"), and "SET" (the logical operation result initially stored in the sense amplifier after the sense amplifier is enabled is always set to "1").

Figure 5:
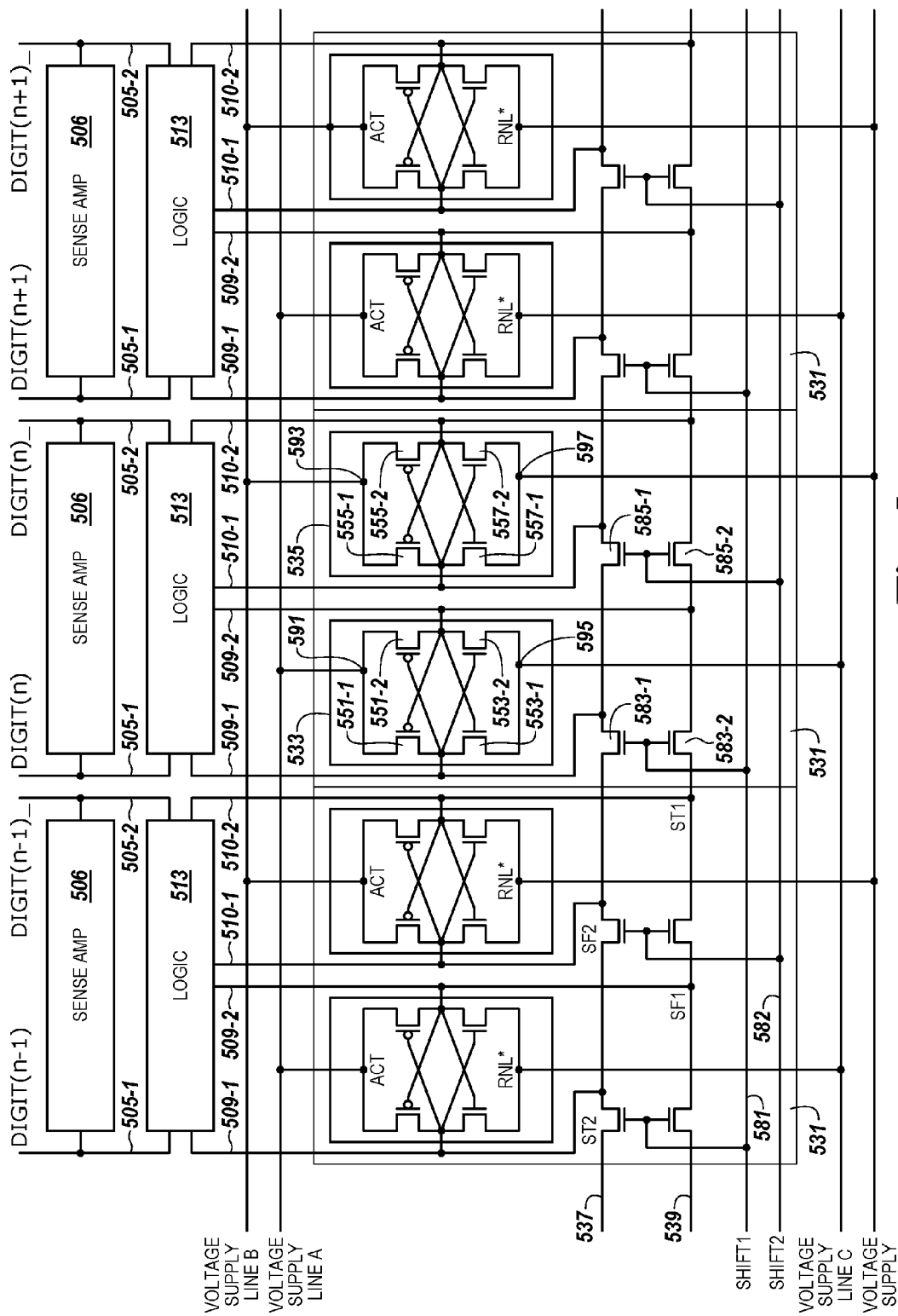
FIG. 5 is a schematic diagram illustrating sensing circuitry in accordance with a number of embodiments of the present disclosure.

FIG. 5 is a schematic diagram illustrating sensing circuitry in accordance with a number of embodiments of the present disclosure. FIG. 5 shows a number of sense amplifiers 506 coupled to respective pairs of complementary digit lines 505-1 and 505-2, and a corresponding number of compute components 531 coupled to the sense amplifiers 506. The sense amplifiers 506, logic circuitry 513, and compute components 531 shown in FIG. 5 can correspond to the sensing circuitry 150 shown in FIG. 1. The sense amplifiers 506, logic circuitry 513, compute components 53 land their respective connections shown in FIG. 5 can correspond to the sense amplifiers 206 and 306, logic circuitry 213 and 313, compute components 231 and 333 their respective connections shown in FIGS. 2 and 3, respectively.

Although not shown, memory cells, such as those described in FIG. 2, are coupled to the pairs of complementary digit lines 505-1 and 505-2. The cells of the memory array can be arranged in rows coupled by access lines and columns coupled by pairs of complementary digit lines DIGIT(n−1)/DIGIT(n−1)_, DIGIT(n)/DIGIT(n)_, DIGIT(n+1)/DIGIT(n+1)_, etc. Although only three pairs of complementary digit lines 505-1 and 505-2 (e.g., three columns) are shown in FIG. 5, embodiments of the present disclosure are not so limited.

As shown in FIG. 5, the sensing circuitry elements can comprise a sense amplifier 506, logic circuitry 513, and a compute component 531 corresponding to respective columns of memory cells (e.g., coupled to respective pairs of complementary digit lines). The sense amplifier 506 can comprise, for example, a cross coupled latch, which can be referred to herein as a primary latch. The sense amplifiers 506 can be configured, for example, as described with respect to FIG. 2.

A data value on the pair of complementary digit lines 505-1 and 505-2 can be the data value stored in the sense amplifier 506 when the sense amplifier is enabled. The data value stored in the sense amplifier 506 can be a first data value. A data value present on the pair of complementary digit lines 505-1 and 505-2 can be stored in the corresponding compute component 531. The data value stored in the sense amplifier 531 can be a second data value. As an example, data values can be stored in the first and second storage locations 533 and 535 of a corresponding compute component 531 by overwriting of the data values currently stored in the first and second storage locations of the corresponding compute components 531 with a data value stored in a corresponding sense amplifier 506. In some embodiments, the compute component 531 can include a pair of storage locations, such as the first storage location 533 and the second storage location 535 associated with each compute component 531. In at least one embodiment, the first storage location 533 and the second storage location 535 can serve as respective stages of a shift register capable of shifting data values (e.g., right and/or left) and/or performing rotation operations (e.g., rotate right and/or rotate left).

In the example illustrated in FIG. 5, each compute component 531 comprises a first storage location 533, which can be a first secondary latch, and a second storage location 535, which can be a second secondary latch. Each compute component 531 can further comprise a number of additional transistors operable to move (e.g., shift) data values right and/or left (e.g., to a first or second storage location of an adjacent compute component 531). The first storage location 533 can be coupled to the logic 513 via the first storage location lines 509-1 and 509-2. The second storage location 535 can be coupled to the logic 513 via the second storage location lines 510-1 and 510-2.

In some embodiments, the first storage location 533 can comprise a cross coupled transistors. For example, the first source drain regions of a pair of transistors such as the n-channel transistors 553-1 and 553-2 are coupled to a first voltage supply line (e.g., voltage supply line A) and a second voltage supply line (e.g., voltage supply line B), respectively, and the second source drain regions are cross coupled with a source drain region of another pair of transistors, such as the p-channel transistors 551-1 and 551-2. In some embodiments, the second storage location 535 can comprise cross coupled transistors. For example, the first source drain regions of a pair of transistors such as the n-channel transistors 557-1 and 557-2 are coupled to a third voltage supply line (e.g., voltage supply line C) and a fourth voltage supply line (e.g., voltage supply line D), respectively, and the second source drain regions are cross coupled with the gates of another pair of transistors, such as the p-channel transistors 555-1 and 555-2. Although not shown in FIG. 5, a power supply transistor can be coupled to each of the voltage supply lines A-D and a reference voltage (e.g., Vdd).

In some embodiments, a first latching/activation signal ACT is applied to the two p-channel transistors 551-1 and 551-2 of the first storage location 533 and a second latching/activation signal RNL* is applied to the two n-channel transistors 553-1 and 553-2 of the first storage location 533. Similarly, a second ACT signal is applied to the two p-channel transistors 555-1 and 555-2 of the second storage location 535 and a second RNL* signal is applied to the two n-channel transistors 557-1 and 557-2 of the second storage location 535. In some embodiments, the respective ACT and RNL* signals control operation of the first storage location 533 and the second storage location 535.

As shown in FIG. 5, power to the first storage location 533 and the second storage location 535 can be provided via a voltage supply line A and a voltage supply line C, and a voltage supply line B and a voltage supply line D, respectively. For example, the first storage location 533 is coupled to voltage supply line A at a power node 591, and the second storage location is coupled to voltage supply line B at a power node 593. The first storage location 533 is coupled to the voltage supply line C via a node 595, and the second storage location 535 is coupled to the voltage supply line D via a node 597.

As shown in FIG. 5, signal input lines 537 and 539 are coupled to respective first storage location lines 509-1 and 509-2. In operation, the voltage on one of the signal input lines 537 or 539 will be slightly greater than the voltage on one of the other signal input lines 537 or 539. The signal input line 537 or 539 having the lower voltage will turn on one of the p-channel transistors 551-1 or 551-2 in the first storage location 533 to a greater extent than the other of the p-channel transistors 551-1 or 551-2, thereby driving higher the first storage location line 509-1 or 509-2 having a higher voltage to a greater extent than the other first storage location line 509-1 or 509-2 is driven high. Similarly, the signal input line 537 or 539 having the lower voltage will turn on one of the p-channel transistors 555-1 or 555-2 in the second storage location 535 to a greater extent than the other of transistors 555-1 or 555-2, thereby driving higher the first storage location line 509-1 or 509-2 having a higher voltage to a greater extent than the other first storage location line 509-1 or 509-2 is driven high.

The signal input line 537 or 539 having the higher voltage will turn on one of the n-channel transistors 553-1 or 553-2 in the first storage location 533 to a greater extent than the other of the transistors 553-1 or 553-2, thereby driving lower the first storage location line 509-1 or 509-2 having the lower voltage to a greater extent than the other first storage location line 509-1 or 509-2 is driven low. Similarly, the signal input line 537 or 539 having the higher voltage will turn on one of the n-channel transistors 557-1 or 557-2 in the second storage location 535 to a greater extent than the other of the transistors 557-1 or 557-2, thereby driving lower the first storage location line 509-1 or 509-2 having the lower voltage to a greater extent than the other first storage location line 509-1 or 509-2 is driven low. Accordingly, as used herein, a "high side" or "high node," and a "low side" or "low node" of the first storage location 533 and/or the second storage location 535 refer to a side of the storage location on which a differential voltage is comparatively high or comparatively low, respectively.

The gates of the first and second sampling transistors 583-1 and 583-2 can be controlled by a shift control signal. For example, an input of the first storage location 533 can be coupled to the first and second sampling transistors 583-1 and 583-2, and an input of the second storage location 535 can be coupled to the third and fourth sampling transistors 585-1 and 585-2. In some embodiments, the first and second sampling transistors 583-1 and 583-2 and/or the third and fourth sampling transistors 585-1 and 585-2 can control storing and/or shifting of data values between the first storage location 533 and the second storage location 535.

In some embodiments, the first and second sampling transistors 583-1 and 583-2 and/or the third and fourth sampling transistors 585-1 and 585-2 may be enabled or disabled in response to a control signal. For example, the first and second sampling transistors 583-1 and 583-2 may be enabled or disabled in response to a control signal applied to the control signal line 581, and the third and fourth sampling transistors 585-1 and 585-2 may be enabled or disabled in response to a control signal line 582, as described in more detail, herein. The control signal line 581 can be used to apply a SHIFT1 (e.g., shift right phase 2, left phase 1 control signal), and the control signal line 582 can be used to apply a SHIFT2 (e.g., shift right phase 1, left phase 2 control signal).

In some embodiments, moving data values from the first storage location 533 to the second storage location 535 can be carried out by controlling which of the power nodes 591, 593, 595, and 597 is providing a voltage to each of the first storage location 533 and the second storage location 535 over time. For example, moving data values from the first storage location 533 to the second storage location 535 can include applying a voltage to the first storage location at the power nodes 591 and/or 595 when a voltage is not applied to the second storage location 535 at the power nodes 593 and/or 597, and synchronously switching the applied voltages such that the voltage is no longer applied to the first storage location 533 at the power nodes 591 and/or 595 and the voltage is instead applied to the second storage location 535 at the power nodes 593 and/or 597. In some embodiments, the first and second sampling transistors 583-1 and 583-2 and/or the third and fourth sampling transistors 585-1 and 585-2 can be enabled when the voltage is switched from the power node 591 to the power nodes 593 and/or 597, or vice versa. In some embodiments, the first storage location 533 and/or the second storage location 535 can be equalized when their respective power node 591/595 or 593/597 is not receiving a voltage signal.

In some embodiments, the second data value can be moved from the first storage location 533 to the second storage location 535 of the compute component 531. The second data value can then be moved from the second storage location 535 to a logic circuitry 513. The logic circuitry 513 can perform a logical operation. A third data value resulting from a logical operation can be stored in the first storage location 533. The data value currently stored in the first storage location 533, such as the second data value, can be overwritten with the third data value. The first data value can be sensed from a memory cell coupled to the pair of complementary digit lines 505-1 and 505-2. The second data value can be sensed with the sense amplifier from a different memory cell coupled to the pair of complementary digit lines 505-1 and 505-2 and the second data value can be moved from the sense amplifier 506 to the first storage location 533.

In some embodiments, the second storage location 535 can be coupled to the logic circuitry 513 at nodes SF2 and ST1 of the compute component 531. A controller (e.g., controller 140 illustrated in FIG. 1) can be configured to move a second data value from a first storage location 533 to a second storage location 535. The controller can also be configured to cause the logic circuitry 513 to perform a logical operation on the first and second data values. The controller can be configured to move the second data value before causing the logical operation to be performed. The controller can be configured to sense the first data value from a memory cell coupled to the pair of complementary digit lines 505-1 and 505-2. The controller can be configured to cause the logic to perform a logical operation on a data value stored in the second storage location 533.

The first data value can be stored in the sense amplifier 506 and the second data value can be stored in the first storage location 533. Additionally, the first data value can be stored in the sense amplifier 506 and the second data value can be stored in the first storage location 533 while the logical operation is being performed. The controller can cause the logical operation to be performed without transferring data (e.g., the first and second data values) via an input/output (I/O) line. The controller can cause a result of the logical operation to be stored in the first storage location 533 as a third data value and cause a fourth data value to be shifted from the second storage location 533 to a different sensing circuitry element (e.g., the sensing circuitry element corresponding to the pair of complimentary digit lines 509-1 and 509-2 denoted as DIGIT(n+1) and DIGIT(n+1)_, respectively).

A number of embodiments can include using the second storage location 533 of a compute component 531 of a sensing circuitry element (e.g., the sensing circuitry element 249 shown in FIG. 2) such that the sensing circuitry element can act as a single-bit processing element capable of performing a number of logical operations in parallel with other sensing circuitry elements. The number of logical operations can be performed in single instruction multiple data (SIMD) fashion. As used herein, SIMD can be defined as performing a same logical operation on multiple sensing circuitry elements simultaneously.

In some embodiments, a controller can be configured to use the second storage location 535 in a logical operation and a data shift operation. The second storage location 535 can be directly coupled to the logic circuitry 513. The sensing circuitry element (shown as the sensing circuitry element 249 in FIG. 2) can be on pitch with the pair of complementary digit lines 505-1 and 505-2.

The first storage location 533 and the second storage location 535 can each operate in at least three stages. A first stage of operation can include an equalization stage in preparation for receiving a differential input signal. In some embodiments, the differential input signal can be received from the signal input lines 537 and/or 539. A second stage of operation can include a sample stage in which the differential input signal is received by the first storage location 533 and/or the second storage location 535. For example, a data value can be received and/or stored by the first storage location 533 and/or the second storage location 535 based on the differential input signal on the first storage location lines 509-1 and 509-2. A third stage of operation can include an "amplify and latch" stage where the received differential input signal is amplified and latched by the first storage location 533 and/or the second storage location 535.

In some embodiments, the third stage can be facilitated by cross coupled transistors 553-1 and 553-2, and 551-1 and 551-2 associated with the first storage location 533, which can amplify the differential voltage on the signal input lines 537 and 539 and operate to latch a data value received at the first storage location 533. Similarly, the coupled transistors 557-1 and 557-2, and 555-1 and 555-2 associated with the second storage location 535, can amplify the differential voltage on signal input lines 537 and 539 and operate to latch a data value received at the second storage location 535. In some embodiments, the third stage can include driving the data value from one storage location to a next storage location (e.g., driving the data value from the first storage location 533 to the second storage location 535).

In some embodiments, an amount of power consumed in shifting data between the storage locations (e.g., the first storage location 533 and the second storage location 535) can be reduced as compared to some approaches through the use of various charge sharing operations, as described in more detail, herein.

For example, an additional stage of operation can be added to the first storage location 533 and/or the second storage location 535. In this embodiment, one storage location can operate as a driving storage location (e.g., the first storage location 533), and another storage location can act as a receiving storage location (e.g., the second storage location 535). The power can be disabled to the driving storage location (e.g., the power on the high side), and the power can be enabled to the receiving storage location such that a charge on a high node (e.g., the node SF1) associated with the driving storage location is shared with the receiving storage location via the node SF2. In some embodiments, this transfer of charge between the driving storage location and the receiving storage location can assist in developing a different signal magnitude (e.g., a signal split) at the receiving storage location than at the driving storage location in the absence of any additional external power. In some embodiments, this charge sharing operation may reduce power consumption associated with shifting data by up to fifteen percent (e.g., a reduction of power consumption of 5 Amps versus a "worst case" power consumption of 30 Amps).

In some embodiments, a charge sharing operation can be applied during the equalization stage of one or more of the storage locations. For example, power to both the high side and the low side can be disabled, and the high side signal charge can be shared with the low side. In operation, this can lead to the resulting voltage between the initially higher side and the initially lower side to equalize in the case where the capacitance on both sides is equal. In some embodiments, this can result in the initially lower side having a higher voltage in the absence of additional external power. Notably, the equalization voltage between the initially higher side and the initially lower side may be offset if the capacitances on both sides are not equal.

In some embodiments, a charge sharing operation can include shorting the high side power node (e.g., the node SF1, which is coupled to voltage supply line A) of the driving storage location to the high side node (e.g., the node ST1, which is coupled to voltage supply line B) of the receiving storage location after a signal split has developed on the receiving storage location. For example, the high side node of the driving storage location can be shorted to the high side node of the receiving storage location when the receiving storage location is in the third stage (e.g., the amplify and latch stage). In some embodiments, shorting the high side node SF1 of the driving storage location to the high side node ST1 of the receiving storage location can be accomplished by adding shorting devices (not shown) in gaps where the high side power drivers are located. In some embodiments, this charge sharing operation can reduce power consumption associated with shifting data by up to fifteen percent (e.g., a reduction of power consumption of 5 Amps versus a "worst case" power consumption of 30 Amps).

In some embodiments, a charge sharing operation can include disabling digit lines 505-1 and 505-2 after the first storage location 533 and the second storage location 535 have received the differential input signal. In operation, this can be achieved by using logic circuitry 513 to decouple (e.g., short, gate, etc.) the first storage location lines 509-1 and 509-2 from the compute component 531. For example, although the compute components 531 are coupled to the logic circuitry 513 circuit to provide processor functionality, once a data value has been received by the first storage location 533 and/or the second storage location 535, the digit lines 505-1 and 505-2 that couple the compute components 531 to the logic circuitry 513 are not required for shifting data between the storage locations of the compute components or for shifting data between compute components 531.

In some embodiments, however, the logic circuitry 513 and/or sense amps 506 can provide a capacitive load to the compute components 531.

In some embodiments, this capacitive load can be reduced by gating the logic circuitry 513 such that gates associated with the logic circuitry 513 (e.g., the transistors 308-1 and 308-2 illustrated in FIG. 3) are pulled low (e.g., to zero) after data values have been received by the first storage location 533 and the second storage location 535 associated with compute component 531. In this regard, the capacitive load associated with logic circuitry 513 can be isolated from the compute components 531 to reduce an amount of power consumed in shifting data among the first and second storage locations 533 and 535, and/or compute components 531.

Although not shown in FIG. 5, each column of memory cells can be coupled to a column decode line that can be activated to transfer, via a local I/O line, data values from corresponding sense amplifiers 506 and/or compute components 351 to a control component external to the array such as an external processing resource (e.g., host processor and/or other functional unit circuitry). The column decode line can be coupled to a column decoder. However, as described herein, in a number of embodiments, data need not be transferred via such I/O lines to perform data shift operations in accordance with embodiments of the present disclosure. In a number of embodiments, shift circuitry can be operated in conjunction with sense amplifiers 506 and compute components 531 to perform data shift operations without transferring data to a control component external to the array, for instance. As used herein, moving data values, which may also be referred to as shifting data values, is an inclusive term that can include, for example, copying data values from a source location to a destination location and/or moving data values from a source location to a destination location without necessarily maintaining a copy of the data values at the source location.

As noted above, the first storage location 533 and the second storage location 535 associated with the compute components 531 can be operated to shift data values left or right from one compute component 531 to another compute component 531. In this example, the first storage location 533 of each compute component 531 is coupled to a corresponding pair of complementary digit lines 505-1/505-2, with a low side power node (e.g., the node ST2, which is coupled to voltage supply line C) being coupled to the particular digit line (e.g., DIGIT(n−1)) communicating a "true" data value and with node SF1 being coupled to the corresponding complementary digit line (e.g., DIGIT (n−1)_) communicating the complementary data value (e.g., "false" data value). The second storage location 535 is coupled to the first storage location 533 via signal input lines 537 and 539 with a low side power node (e.g., the node SF2, which is coupled to voltage supply line D) being coupled to a particular signal input line (e.g., signal input line 537) and node ST1 being coupled to a particular signal input line (e.g., signal input line 539).

An example of shifting data right according to the disclosure can include operating control signal lines 581 and 582 to move data values right from a first storage location 533 associated with one compute component 531 through the first and second sampling transistors 583-1 and 583-2 to a second storage location 535 associated with the compute component 531. For example, activation of control signal 582 causes the data value from node SF1 to move right through the third and fourth sampling transistors 585-1 and 585-2 to node ST1 of a right-adjacent compute component 531. Subsequent activation of control signal 581 causes the data value from node ST1 to move through the first and second sampling transistors 583-1 and 583-2 right to node SF1, which completes a right shift by one compute component 531. Data can be "bubbled" to the left/right by repeating the left/right shift sequence multiple times. Data values can be latched (and prevented from being further shifted) by maintaining control signal 581 activated and control signal 582 deactivated (e.g., such that feedback is enabled for the respective compute component latches and such that the respective latches are isolated from each other). In a number of embodiments, the control signals SHIFT1, and/or SHIFT2 on the control signal lines 581 and 582, respectively, can be shift clock signals such as those described below. As an example, although the control signals SHIFT1 and SHIFT2 are identified on the left side of FIG. 5, the signals can be initiated on either end of the sensing circuitry in accordance with a number of embodiments described herein. For example, in association with shifting data leftward via the compute components 531, clock signals associated with shifting the data can be initiated on the rightmost end of the array and can be propagated leftward. In a similar manner, in association with shifting data rightward via the compute components 531, clock signals associated with shifting the data can be initiated on the leftmost end of the array and can be propagated rightward.

Embodiments of the present disclosure are not limited to the shifting capability described in association with the compute components 531. For example, a number of embodiments can include shift circuitry in addition to and/or instead of the shift circuitry described in association with a shift register.

Figure 6:
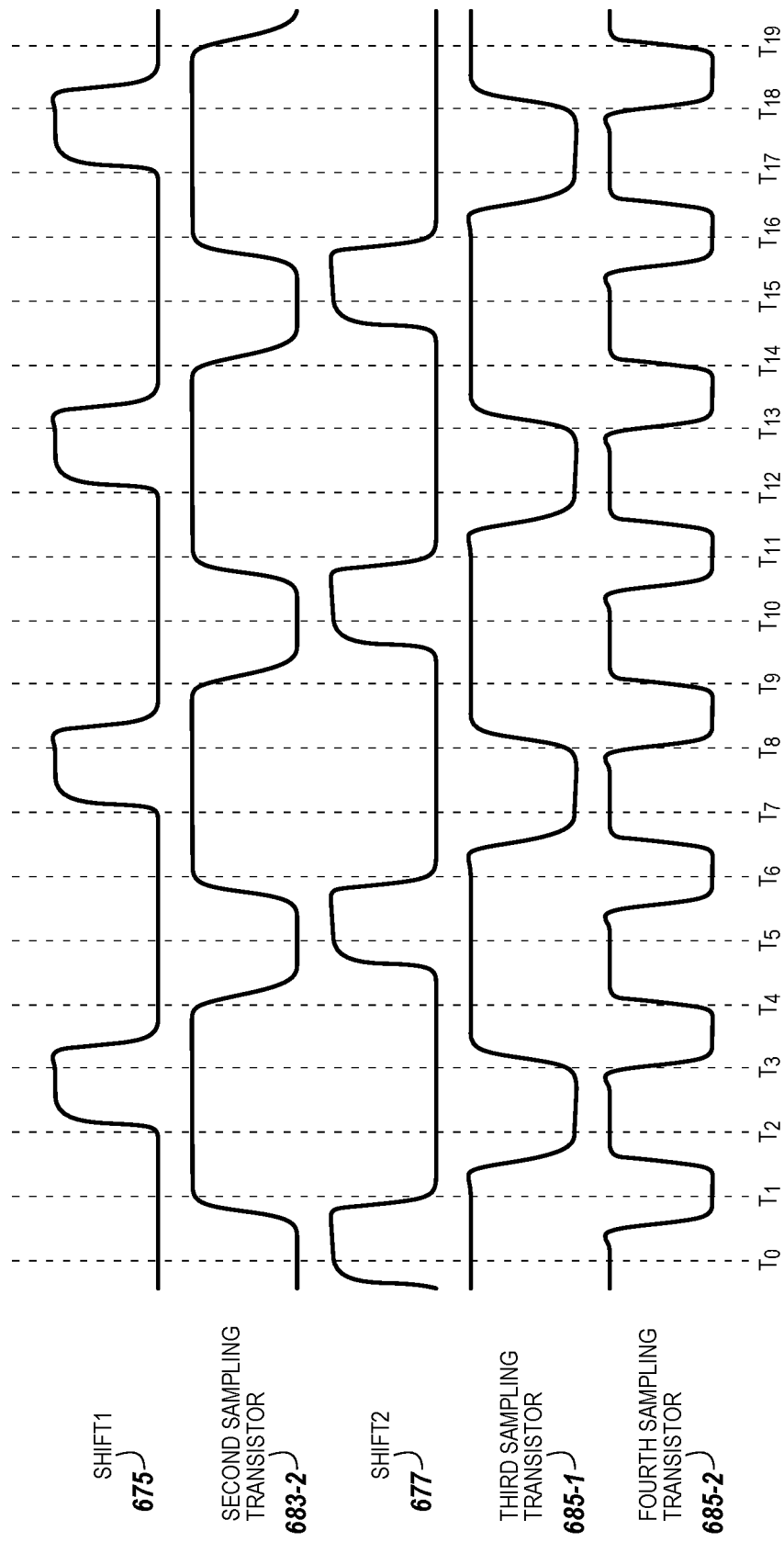
FIG. 6 is a timing diagram including shift signals, power gates, and a charge sharing transistor in accordance with a number of embodiments of the present disclosure.

FIG. 6 is a timing diagram including the control signals, the behavior of the power transistors and the charge sharing transistor in accordance with a number of embodiments of the present disclosure. In the example of FIG. 6, the control signal SHIFT1 675 and the control signal SHIFT2 677 associated with shifting data are illustrated. The behaviors of transistors illustrated in FIG. 5 are also shown: the behavior 683-2 of the second sampling transistor 583-2, the behavior 685-1 of the third sampling transistor 585-1, and the behavior 685-2 of the fourth sampling transistor 585-2 as the control signals are applied.

As illustrated in FIG. 6, the control signal SHIFT2 677 may be driven high while the control signal SHIFT1 675 is low. In this example, the behavior 683-2 shows that the fourth sampling transistor 583-2 is initially low, while the behaviors 685-1 and 685-2 show that the third sampling transistor 585-1 and the fourth sampling transistor 585-2 are initially high. The control signal SHIFT2 677 can be subsequently driven low and the control signal SHIFT1 675 can be driven high.

When the control signal SHIFT2 677 low and the control signal SHIFT1 675 is high, a voltage can be applied to the second sampling transistor 583-2 and/or a voltage can be disabled to the third sampling transistor 585-1. Data values can be moved between a first storage location 533 and a second storage location 535 based on when the control signal SHIFT2 677 and the control signal SHIFT1 675 are high and low. For example, a data value can be moved (e.g., rightward) from the first storage location 533 to the second storage location 535 when the control signal SHIFT2 677 goes high as the control signal SHIFT1 675 goes low. In order to move a data value the opposite direction (e.g., leftward) the operation of the shift signals can be reversed. For example, a data value can be moved leftward when the control signal SHIFT2 682 goes low as the control signal SHIFT1 675 goes high. In some embodiments, enabling (e.g., driving high) the control signal SHIFT2 677 and/or the control signal SHIFT1 675 can include applying a voltage to one or more of the storage locations in the compute components.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
moving a first data value from a first storage location of a compute component of a sensing circuitry element to a second storage location of the compute component, wherein moving the first data value includes applying a charge sharing operation between the first storage location and the second storage location.

2. The method of claim 1, further comprising controlling logic circuitry of the sensing circuitry element to perform a logical operation on the first data value and a second data value.

3. The method of claim 1, wherein the charge sharing operation comprises shorting a node of the first storage location to a node of the second storage location.

4. The method of claim 1, wherein the charge sharing operation comprises gating nodes associated with the logic circuitry to isolate logic circuitry during the charge sharing operation.

5. The method of claim 1, wherein the charge sharing operation comprises:
applying a first voltage to the first storage location;
applying a second voltage to the second storage location; and stopping the application of the first voltage to the first storage location in response to the second voltage being applied to the second storage location.

6. The method of claim 1, further comprising storing, in the first storage location, a third data value resulting from a logical operation performed using the first data value and a second data value.

7. The method of claim 1, wherein applying the charge sharing operation comprises stopping an application of a voltage to the first storage location and the second storage location to share a charge associated with the first storage location and the second storage location.

8. An apparatus, comprising:
a sensing circuitry element including a sense amplifier and a compute component, the compute component comprising a first storage location and a second storage location; and
a controller coupled to the sensing circuitry element and configured to:
move a first data value from the first storage location of the compute component to the second storage location of the compute component by applying a charge sharing operation between the first storage location and the second storage location.

9. The apparatus of claim 8, wherein the controller is further configured to cause a node of the first storage location to be shorted to a node of the second storage location as part of the charge sharing operation.

10. The apparatus of claim 8, wherein:
the sensing circuitry element further comprises logic, and the controller is configured to cause the logic circuitry to perform a logical operation on the first data value and a second data value.

11. The apparatus of claim 10, wherein the controller is further configured to cause a third data value resulting from performance of the logical operation to be stored in the first storage location.

12. The apparatus of claim 8, further comprising a plurality of transistors coupled to the compute component, wherein the controller is configured to assert a precharge signal to gates transistors among the plurality of transistors as part of application of the charge sharing operation.

13. An apparatus, comprising:
a sensing circuitry element, including:
a sense amplifier coupled to logic circuitry;
a first storage location coupled to the logic circuitry; and
a second storage location coupled to the first storage location; and
a controller coupled to the sensing circuitry element, wherein the controller is configured to:
disable, during a clock cycle, a power associated with the first storage location; and
disable, during the clock cycle, a power associated with the second storage location such that a charge between the first storage location and the second storage location is shared.

14. The apparatus of claim 13, wherein the controller is further configured to cause a logical operation to be performed on a first data value stored in the sense amplifier and a second data value stored in the second storage location.

15. The apparatus of claim 14, wherein the controller is further configured to cause a result of the logical operation to be stored in the first storage location.

16. The apparatus of claim 14, wherein the controller is configured to cause the logical operation to be performed without transferring the first data value or the second data value via an input/output (I/O) line.

17. The apparatus of claim 13, wherein the sensing circuitry element is configured to act as a single-bit processing element capable of performing a logical operation in parallel with other sensing circuitry elements.

18. The apparatus of claim 13, further comprising:
a first transistor coupled to the first storage location;
a second transistor coupled to the second storage location, wherein a gate of the first transistor and a gate of the second transistor are coupled to a precharge signal line.

19. The apparatus of claim 13, wherein the controller is configured to control coupling a node of the first storage location to a node of the second location such that the node of the first storage location is shorted to the node of the second location such that the charge between the first storage location and the second storage location is shared.

20. The apparatus of claim 13, wherein the controller is configured to cause a data value stored in the first storage location to be shifted to the second storage location.

* * * * *